(12) United States Patent
Chittipeddi et al.

(10) Patent No.: US 6,472,304 B2
(45) Date of Patent: Oct. 29, 2002

(54) WIRE BONDING TO COPPER

(75) Inventors: Sailesh Chittipeddi, Allentown, PA (US); Sailesh Mansinh Merchant, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/864,577

(22) Filed: May 24, 2001

(65) Prior Publication Data

US 2001/0036716 A1 Nov. 1, 2001

Related U.S. Application Data

(63) Continuation of application No. 09/236,406, filed on Jan. 23, 1999.

(51) Int. Cl.[7] .............................................. H01L 21/44
(52) U.S. Cl. ...................... 438/612; 438/614; 438/629; 438/633; 438/687; 438/688
(58) Field of Search ................................. 438/617, 614, 438/613, 612, 625–629, 622, 633, 637–640, 687, 688

(56) References Cited

U.S. PATENT DOCUMENTS

| | | | | |
|---|---|---|---|---|
| 3,733,685 A | * | 5/1973 | Kauppila | 29/470.1 |
| 4,845,543 A | * | 7/1989 | Okikawa et al. | 357/67 |
| 4,933,305 A | * | 6/1990 | Kikkawa | 437/211 |
| 5,968,333 A | * | 10/1999 | Nogami et al. | 205/184 |
| 6,069,068 A | * | 5/2000 | Rathore et al. | 438/628 |
| 6,117,769 A | * | 9/2000 | Nogami et al. | 438/653 |
| 6,197,688 B1 | * | 3/2001 | Simpson | 438/678 |

FOREIGN PATENT DOCUMENTS

| | | | |
|---|---|---|---|
| JP | 5982737 | * | 5/1984 |
| JP | 63128634 | * | 6/1988 |

* cited by examiner

*Primary Examiner*—Tuan H. Nguyen
*Assistant Examiner*—Thanhha Pham
(74) *Attorney, Agent, or Firm*—Peter V. D. Wilde; Thomas, Kayden, Horstemeyer & Risley LLP

(57) ABSTRACT

The specification describes techniques for wire bonding gold wires to copper metallization in semiconductor integrated circuits. A barrier layer is formed on the copper, and an aluminum bonding pad is formed on the barrier layer. Gold wire is then thermocompression bonded to the aluminum pad.

3 Claims, 8 Drawing Sheets

WIRE BONDING TO COPPER

This application is a continuation of Ser. No. 09/236,406 filed on Jan. 23, 1999.

FIELD OF THE INVENTION

This invention relates to the manufacture of integrated circuits and more particularly to methods for bonding gold wire interconnections to copper metallization.

BACKGROUND OF THE INVENTION

In the evolution of semiconductor manufacturing, one of the enduring technologies is wire bonding. Wire bonding was used to interconnect the earliest IC chips to lead frames to make single IC packages. As the chip technology developed, more complex packages with higher levels of chip integration, e.g. multichip modules, were required and the need arose for interconnecting these modules to each other and to support boards. TAB bonding and bump bonding evolved as efficient interconnect technologies for these packages, but wire bonding is still a cost competitive technology, and wire bonding applications remain in current IC manufacture.

In the development of IC interconnect technology, copper was identified early as a desirable candidate for IC interconnections. Copper is highly conductive, is inexpensive, and the metallurgy of copper was well developed. However, early experience with copper as an interconnect material was poor. Copper is electrolytically very active and causes migration problems in semiconductors. In wire bonded packages, copper metallization cannot be used since it readily alloys with gold wire bonds and Cu—Au alloys are not robust. Because of the known problems with copper, aluminum, an inferior conductor, became the material of choice for IC metallization. Acceptance of aluminum metallization became so entrenched that other options have remained in the background.

IC technology has now advanced to the point where the conductivity of aluminum is becoming a limiting factor in IC design. This has caused process designers to revisit metallization material options. One that has re-emerged as promising is copper. However, integrating copper metallurgy into current IC processing raises newer versions of the old problems. One of these is wire bonding gold wires to copper metallization.

SUMMARY OF THE INVENTION

We have developed a process for gold wire bonding to copper metallization. It involves forming a barrier layer on the copper, and forming an aluminum pad on the barrier layer. Gold wire is then thermocompression bonded to the aluminum pad.

DETAILED DESCRIPTION

Figure 1:
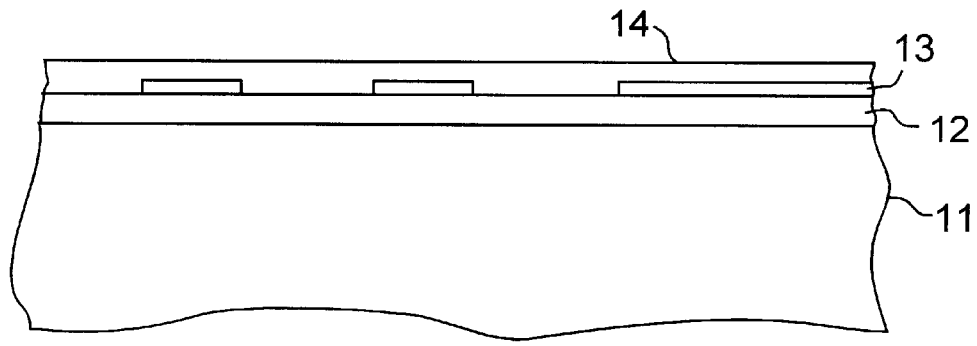
FIGS. 1–24 are schematic representations of steps useful for implementing the process of the invention.

With reference to FIG. 1, a silicon substrate 11 is shown partially cut away to indicate that is a portion of a much larger silicon wafer. It will be understood that these drawings are not to scale, and some features are shown exaggerated for convenience in this exposition. The silicon substrate is covered with a first oxide layer 12, typically the field oxide, a metal interconnect level 13, and an interlevel dielectric layer 14, which is typically deposited oxide, or other suitable dielectric material. Low E organic materials, such as xerogel or aerogel, are also suitable and can be applied using spin-on techniques. These elements are standard in silicon IC technology and form no part of the invention. The invention will be described using this basic structure as a starting point, but it will be recognized by those skilled in the art that typical integrated circuits may have three or four metal levels. Metal level 13 should be taken as the next to last metal level, even though other levels are typically present but not shown.

Figure 2:
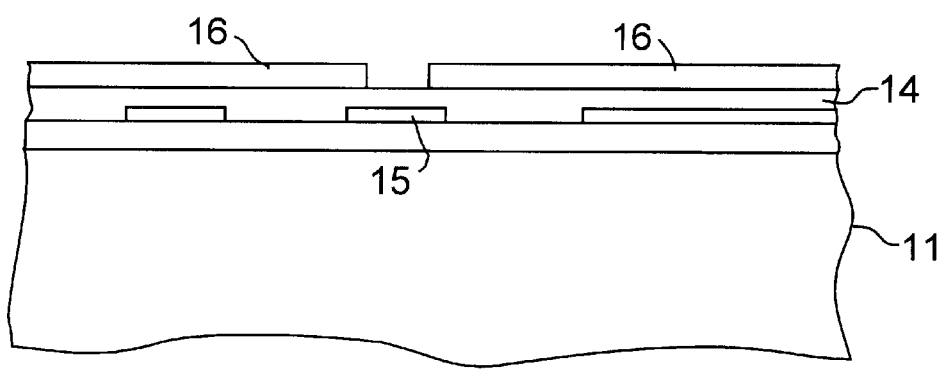
Figure 3:
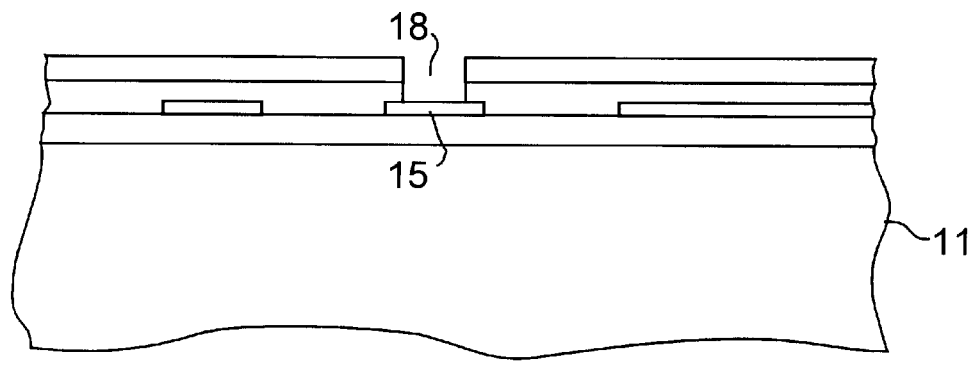
Figure 4:
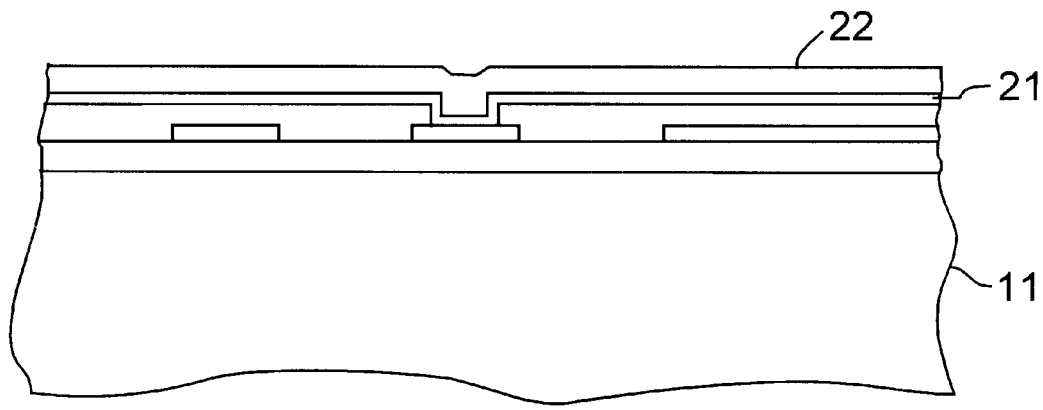
Figure 5:
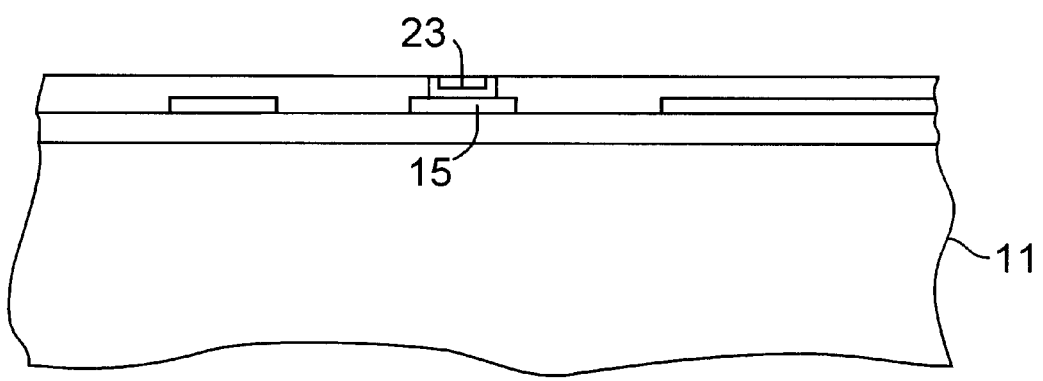

With reference to FIG. 2, a photolithographic mask 16 is applied to the dielectric layer 14, and patterned to expose portions of the interlevel dielectric where interlevel interconnections are to be made. It will be understood that where photolithography or photomasks are mentioned in this description, other lithographic processes, such as x-ray or e-beam lithography, can be substituted. Using the photoresist as an etch mask, window 18 is formed through the interlevel dielectric, as shown in FIG. 3, for interlevel interconnection to metal runner 15. Next the interlevel window 18 is plugged by depositing a suitable window plug material over the dielectric and into the window. For example, a dual layer of e.g. TiN and tungsten, represented by layers 21 and 22 in FIG. 4, can be used. The wafer is then treated by chemical mechanical polishing (CMP) to produce the structure shown in FIG. 5. Techniques for CMP of TiN/W layers are described in U.S. patent application Ser. No. 09/151,077, filed on Sep. 10, 1998. The window is now plugged with metal plug 23, and the structure is ready for deposition of the next metallization layer. As will be appreciated, removal of the metal by the CMP step of FIG. 5 results in a more planar structure than is produced using the more conventional mask and etch process, especially in cases where this sequence is repeated several times to form multiple metal levels.

However, for the purposes of the invention, any suitable process for forming the interlevel interconnection can be used.

Figure 6:
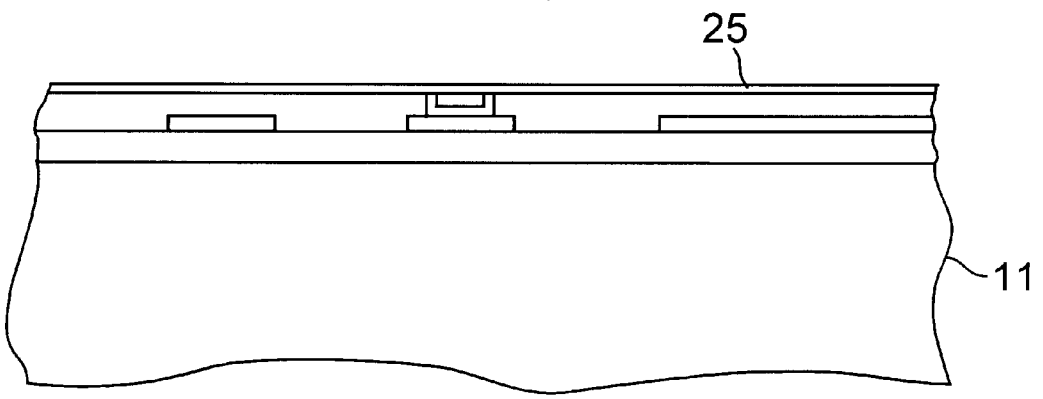

Referring to FIG. 6, an etch stop layer 25 is then blanket deposited over the interlevel dielectric and interlevel windows as shown. A suitable etch stop layer is silicon nitride which withstands typical oxide etchant processes, e.g. RIE etch methods, and protects the interlevel plug when forming. The thickness of the etch stop layer is typically 500–1500 Angstroms.

Figure 7:
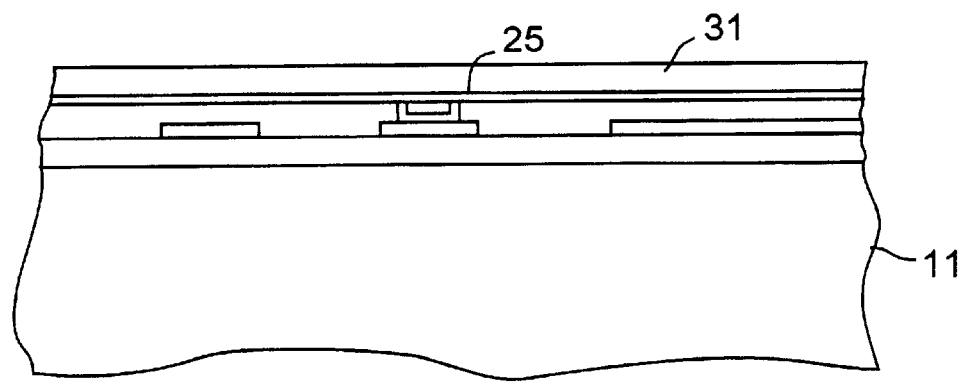
Figure 8:
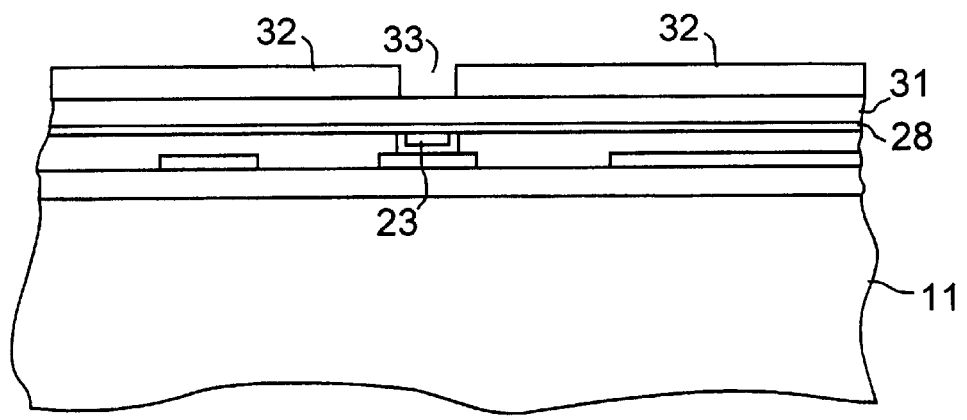
Figure 9:
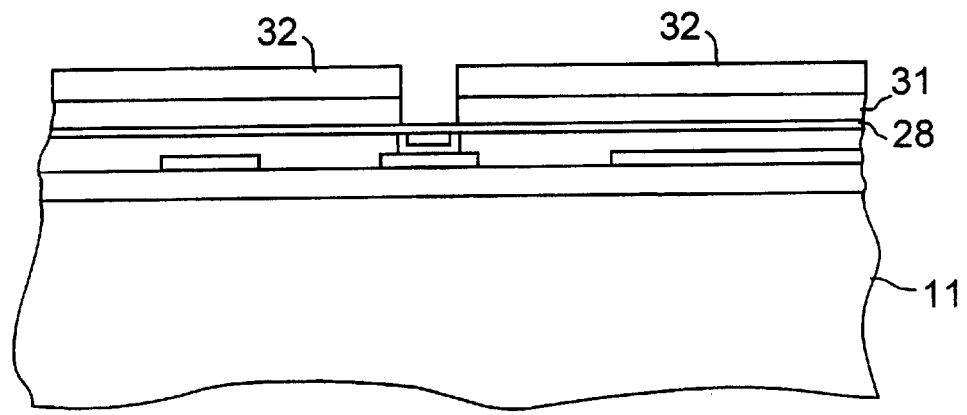
Figure 10:
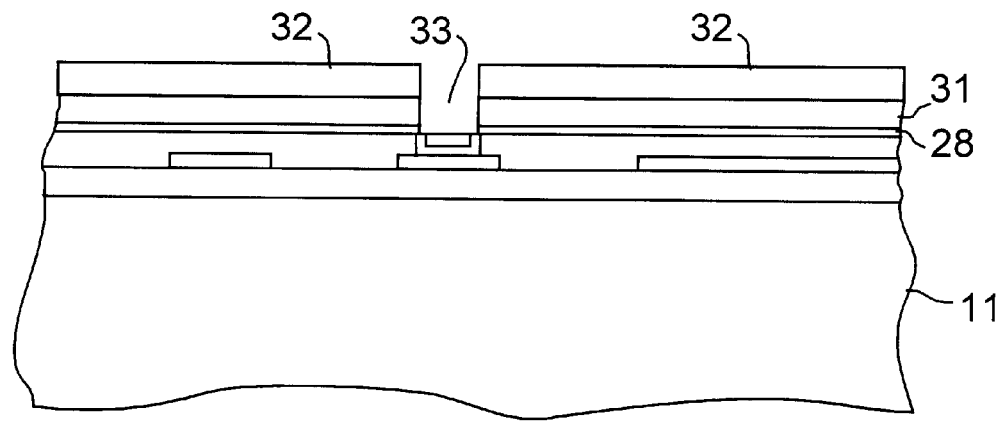

With reference to FIG. 7, dielectric layer 31 is deposited over the structure, and masked with lithographic mask 32 as shown in FIG. 8. Mask 32 is patterned to provide opening 33 to form an opening over the tungsten plug 23. As indicated in FIG. 9, the exposed oxide is etched away, preferably using RIE, and the silicon nitride etch stop in window 33 is removed to leave the structure of FIG. 10.

Figure 11:
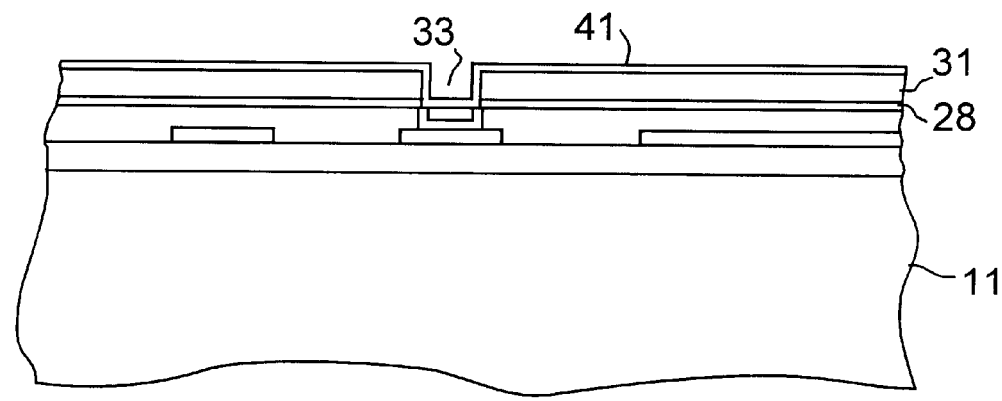

With reference to FIG. 11, a barrier layer 41 is blanket deposited over the surface of the structure and into the window as shown. This layer is the first step in defining the copper interconnection layer which, in the sequence described here, is the last, or the top, metal layer in the IC, and is the layer to which wire bonds are to be made. Other copper metallization levels may also be present in structure, but the invention pertains to the last metal level to which interconnection is made by wire bonding. The preferred material for barrier layer 41 is Ta, TaN, Ti, or TiN, although other materials may be used. The barrier layer can be deposited by chemical vapor deposition (CVD) or physical vapor deposition (PVD). A 100–1000 Angstrom layer is suitable.

Figure 12:
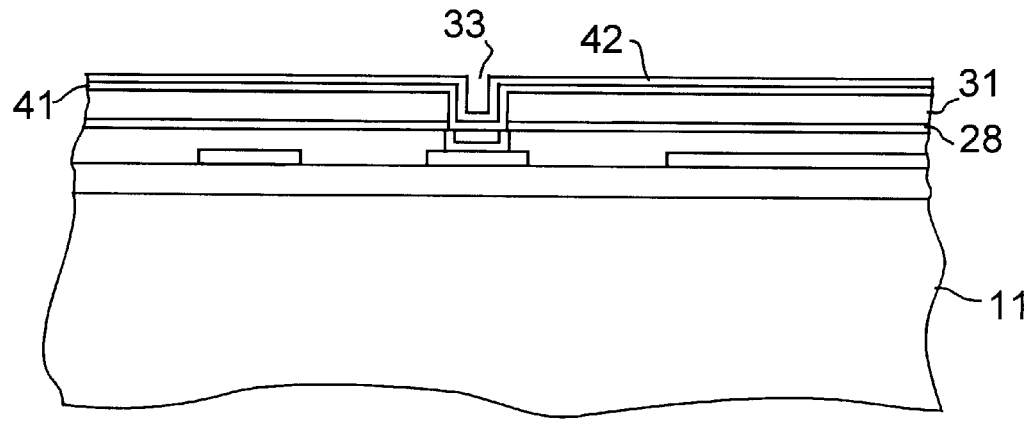
Figure 13:
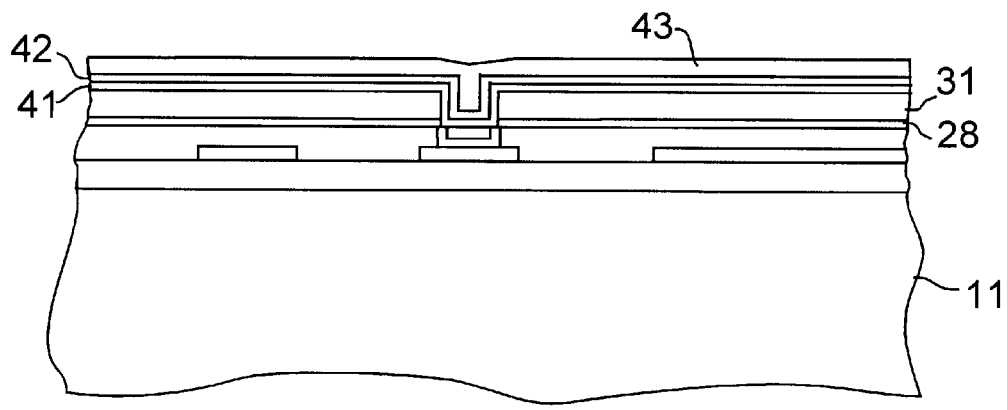
Figure 14:
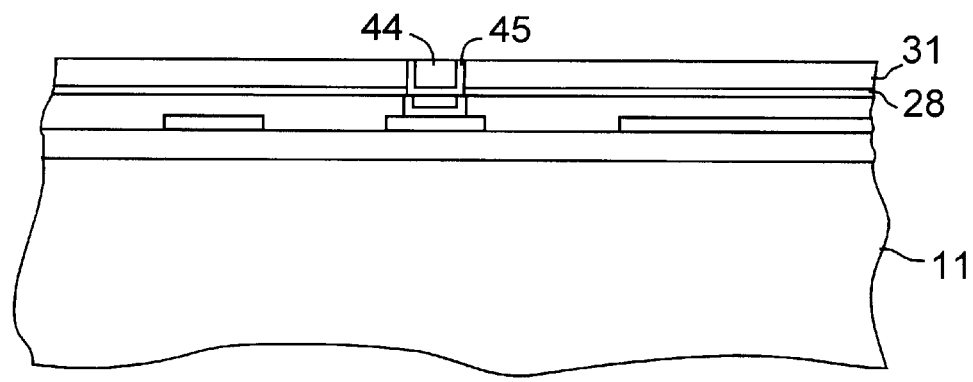

With reference to FIG. 12, a copper strike layer 42 is then blanket deposited by PVD. The thickness of the copper strike layer may be just sufficient to provide a seed layer over the surface for blanket electrolytic deposition, e.g. 1000–2000 Angstroms. The copper seed layer 42 enables electrolytic deposition, by standard techniques, of copper layer 43. The thickness of layer 43 should be sufficient to completely plug the opening 33 (FIG. 12) as shown in FIG. 13, and is preferably 1.2–1.6 times the height of the opening. Next, the surface is planarized using CMP in the manner described before, to produce the structure shown in FIG. 14 with copper plug 44 surrounded on the sides and bottom by barrier layer 45.

Figure 15:
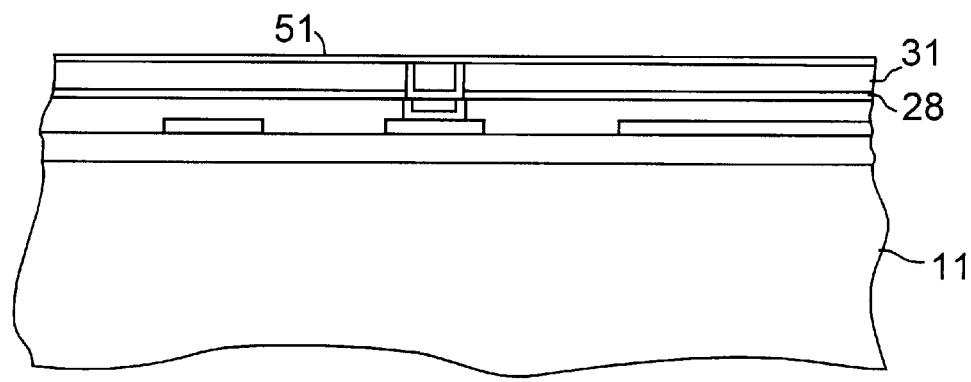

To encapsulate the top of copper plug 44, a second barrier layer 51 is blanket deposited over the structure as shown in FIG. 15. This barrier layer has essentially the same prescription as barrier layer 41 and ensures that all sides of the copper metallization layer are sealed to prevent copper migration in the IC.

Figure 16:
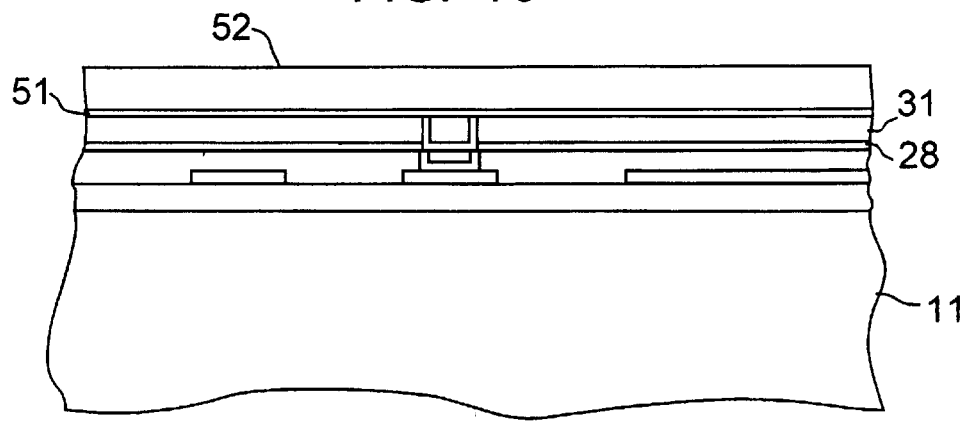

Wire bond contact is then made to the copper metallization layer as shown in FIGS. 16–20. With reference to FIG. 16, the thin barrier layer 51 is covered with a thick layer of aluminum 52. The aluminum layer 52 may be deposited by CVD or PVD and has a thickness preferably in the range 0.2–1.0 $\mu$m.

Figure 17:
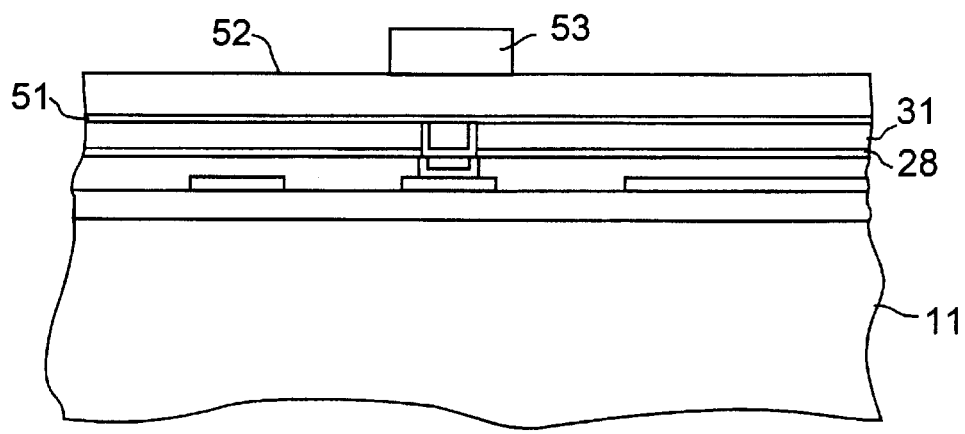
Figure 18:
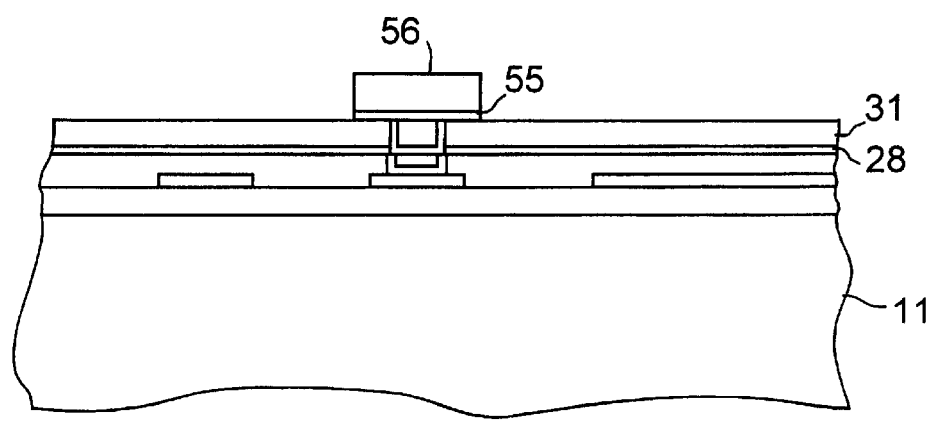
Figure 19:
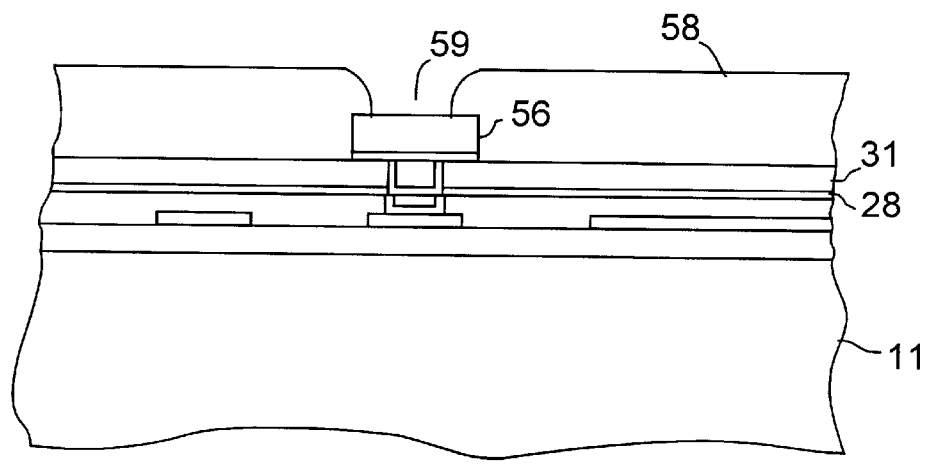

A lithographic mask 53 is then applied to etch layers 51 and 52 to define the aluminum bonding pad, as shown in FIG. 17, and the unwanted portions of these layers are etches away using conventional techniques to produce the bonding pad 56, separated from the copper plug by barrier layer 55 as shown in FIG. 18. Typically there will be many bonding pads 56 on this level. With reference to FIG. 19, a conventional passivating layer 58 is then applied to cap the IC. The capping layer may be $Si_3N_4$ (SINCAPS) or may be a polymer such as polyimide. Preferably the capping layer is photodefinable polyimide. The capping layer 58 is then patterned, if photodefinable, or masked and etched to form window 59 and expose the surface of aluminum bond pad 56, as shown in FIG. 19. Standard photoresist and etching techniques can be used to pattern silicon nitride. If layer 58 is photodefinable polymer, the photoresist can be omitted and the layer itself patterned by exposure and development.

Figure 20:
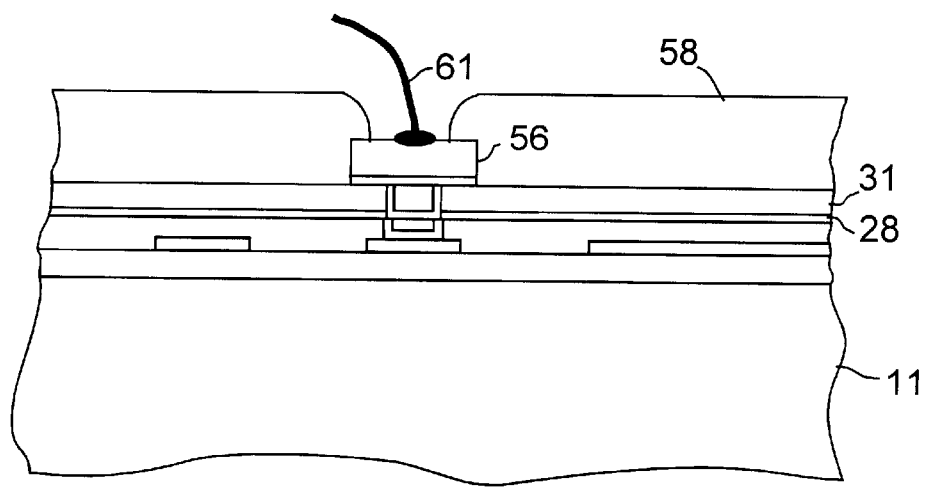

Referring to FIG. 20, wire 61 is bonded to the aluminum pad 56 by thermocompression (TC) bonding. The wire is preferably gold, or a gold alloy with small amounts of metal additives, such as Au—Be, for hardening etc. The diameter of the wire is typically 0.5–2 mils, and preferably 1–1.2 mils. The area of the aluminum bond pads is typically in the range 1000–40000 $\mu m^2$ and preferably 5000–25000 $\mu m^2$. The TC bonding operation is standard. The force may be 15–60 grams, preferably 40–60 grams. The ultrasonic frequency is in the range 40–200 kHz, preferably 60–120 kHz, and the power in the range 20–200 mW, preferably 50–100 mW. These parameters are suitable for a variety of bonding tools including, e.g. K & S wire bonders.

Figure 21:
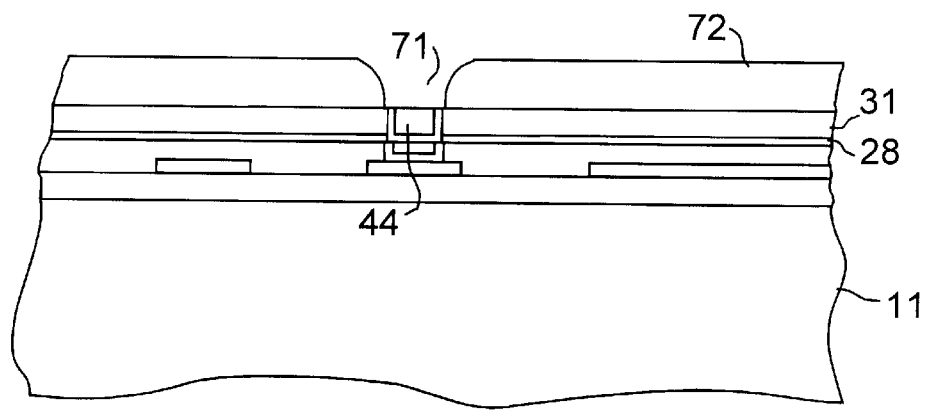
Figure 22:
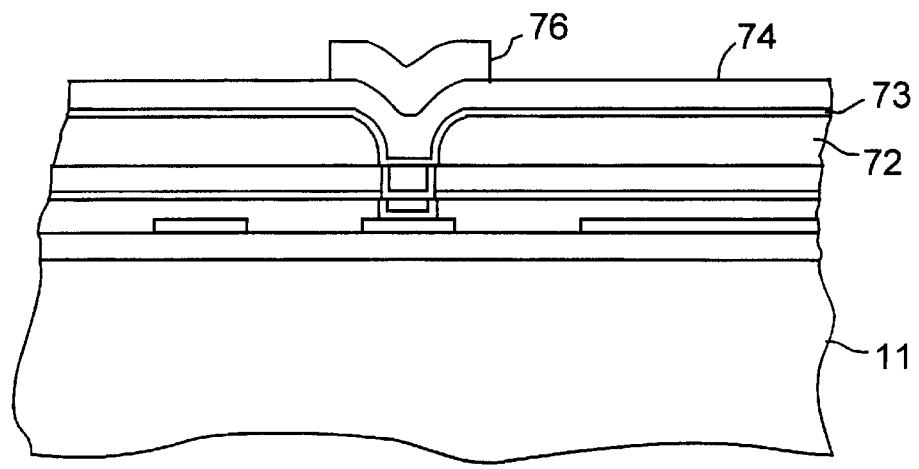
Figure 23:
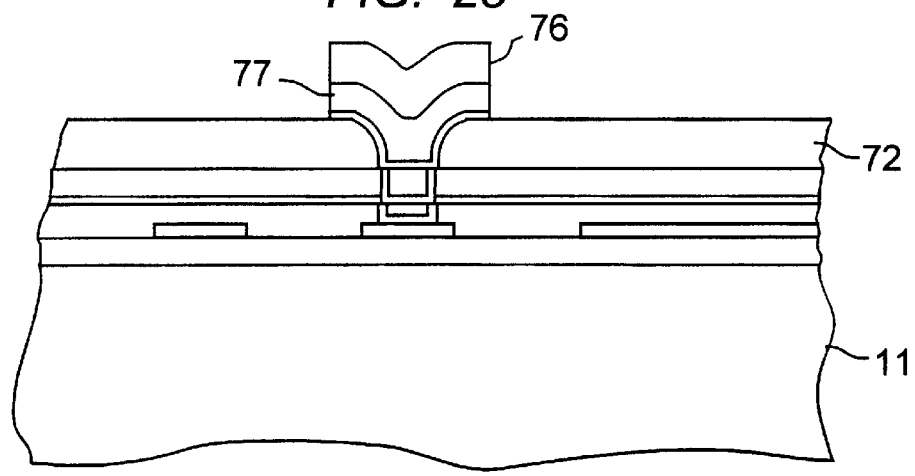
Figure 24:
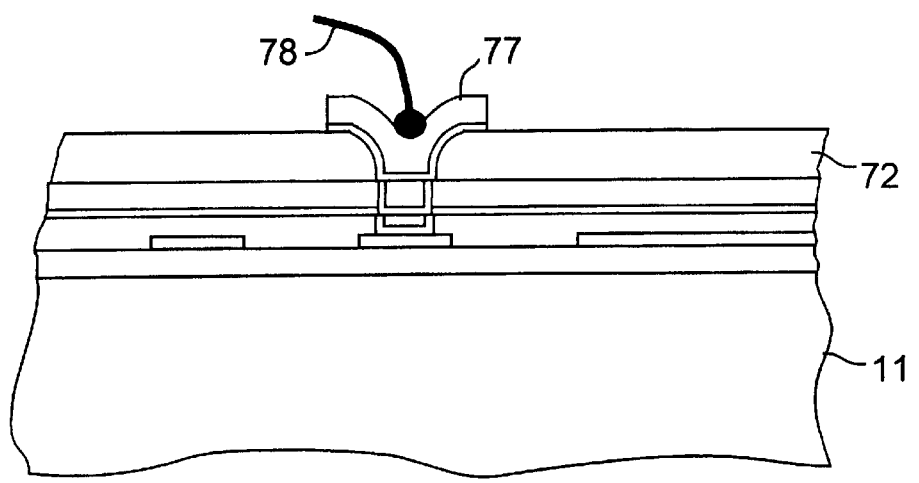

An alternative approach to the last few steps of the process described above is shown in FIGS. 21–24. Starting with the structure of FIG. 14, the cap layer 72 is applied prior to the aluminum bonding pad layer. In FIG. 21, window 71 is shown in cap layer 72. Window 71 exposes the copper metallization 44. Barrier layer 73 and aluminum layer 74 are blanket deposited over the cap layer 72, as shown in FIG. 22 and into the window to contact the copper metallization layer. Aluminum layer 74 is then masked with mask 76, as shown in FIG. 22, and layers 74 and then 73 are etched to form aluminum bond pad 77 in FIG. 23. Referring to FIG. 24, the mask is removed and the gold TC wire bond 78 applied to complete the interconnection.

In the embodiments of the invention described above the last metal pattern is copper, and the barrier layers as described are intended to isolate the copper and prevent migration into regions of different metallurgy below. However, if the underlying levels are also comprise copper metallization the last level, the level shown in the Figures, need not have the barriers shown between metallization levels. It is still important in any case that an effective barrier be present between the last copper bonding region and the aluminum wire bonding pad.

The processes described above were developed for silicon CMOS integrated circuits but can apply equally to other kinds of semiconductor integrated circuits such as III-V photonic integrated circuits. These integrated circuits typically have GaAs or InP substrates and multilevels of III-V ternary and/or quaternary layers forming the active devices. However, the interconnections can in some applications be similar to those used in silicon IC technology. These circuits also typically operate at very high speeds where copper metallization is distinctly advantageous.

Most silicon integrated circuits manufactured today have polysilicon gates for the transistor devices, and the first level metal is typically polysilicon to form the gates and form interconnections for those gates. The metal interconnect levels formed after the first level are usually aluminum, and one to three aluminum levels are typical. Of these one or more, will be substituted with copper according to the teachings described above. At least one of the copper levels has wire bonding sites which are converted to aluminum bonding sites according to the invention. Reference to a first metallization level or a second metallization level should be understood to refer to the first or second levels recited, not necessarily to the first or second levels in the IC structure.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of semiconductor integrated circuits comprising the sequential steps of:
   (a) forming a first conductive interconnection layer on a semiconductor substrate,
   (b) depositing a first dielectric layer on said first conductive interconnection layer,
   (c) forming at least one interlevel opening in said first dielectric layer to expose a portion of said first conductive interconnection layer,
   (d) depositing a first barrier layer on said first dielectric layer, and into said interlevel opening,
   (e) depositing a copper layer on said first barrier layer, said copper layer having a thickness sufficient to fill said interlevel opening, and being deposited by the steps of:
      1. depositing a strike layer of copper on the first barrier layer, and
      2. electrolytically depositing a copper layer on the strike layer,
   (f) planarizing the surface of the structure produced in step (e) using chemical mechanical polishing leaving a planar copper plug in a planar surface,
   (g) depositing a planar barrier layer on said planar surface and on said copper plug, (h) depositing a planar aluminum layer on said planar barrier layer, (i) forming a mask on the planar aluminum layer overlying the copper plug leaving portions of the planar aluminum layer exposed, (j) etching away the exposed portions of said planar aluminum layer and said planar barrier layer to leave a planar barrier layer pad and a planar aluminum layer pad on said copper plug, and (k) thermocompression bonding a conductive wire to said planar aluminum layer pad.

2. The method of claim 1 wherein the semiconductor of the integrated circuit is silicon.

3. The method of claim 1 wherein said wire comprises gold and is bonded using thermocompression bonding.

* * * * *